United States Patent [19]

Rostami

[11] Patent Number: 4,908,427

[45] Date of Patent: Mar. 13, 1990

[54] POLYMER COMPOSITION

[75] Inventor: Shamsedin Rostami, Middlesbrough, England

[73] Assignee: Imperial Chemical Industries PLC, London, England

[21] Appl. No.: 326,489

[22] Filed: Mar. 20, 1989

Related U.S. Application Data

[63] Continuation of Ser. No. 73,192, Jul. 14, 1987, abandoned.

[30] Foreign Application Priority Data

Jul. 23, 1986 [GB] United Kingdom ............... 8617989

[51] Int. Cl.$^4$ .................. C08G 8/02; C08G 14/00; H01B 3/42; H01B 7/02
[52] U.S. Cl. ........................... 528/125; 528/126; 528/128; 528/171; 525/471; 525/390; 428/378; 428/901; 174/110 SR
[58] Field of Search ............... 528/125, 126, 128, 171; 525/471, 390; 428/378, 901; 174/110 SR

[56] References Cited

U.S. PATENT DOCUMENTS

| | | | |
|---|---|---|---|
| 3,634,355 | 1/1972 | Barr et al. | 528/171 |
| 4,320,224 | 3/1982 | Rose et al. | 528/125 |
| 4,731,429 | 3/1988 | McMaster et al. | 528/127 |

FOREIGN PATENT DOCUMENTS

| | | |
|---|---|---|
| 212805 | 3/1987 | European Pat. Off. . |
| 247512 | 12/1987 | European Pat. Off. . |

*Primary Examiner*—John Kight
*Assistant Examiner*—M. L. Moore
*Attorney, Agent, or Firm*—Cushman, Darby & Cushman

[57] ABSTRACT

A polymer composition containing a polyaryletherketone and a polysulphone, where the polysulphone contains the repeating units —Ph—SO$_2$—Ph—Ph—SO$_2$—Ph— and

—Ar— linked through ether linkages. The polysulphone contains 50 to 75% molar of the units —Ar—, and Ar may contain more than one aromatic group linked by aliphatic hydrocarbon groups, or by —SO—, —SO$_2$— or —CO—.

A composition containing a high proportion of the polyaryletherketone shows a reduced shrinkage compared to the polyaryletherketone alone. A composition containing a high proportion of the polysulphone has improved solvent resistance and stress crack resistance compound to the polysulphone alone. The composition can be used for production of film or fibre or for wire coating or may include other additives such as fillers or fibrous reinforcing agents, e.g. glass or carbon fibre.

3 Claims, No Drawings

POLYMER COMPOSITION

This is a continuation of Application No. 07/073,192, filed July 14, 1987, which was abandoned upon the filing hereof.

The invention relates to a polymer composition, in particular containing aromatic polymers, to the use thereof to form shaped articles, and to shaped articles so formed.

Among polymers in which benzene rings are linked together through oxygen atoms or sulphone or ketone groups, the polyarylethersulphones are generally amorphous and have a glass transition temperature (Tg) of at least 150° C. or even 200° C. and higher, but many of them have poor resistance especially to stress cracking in the presence of many solvents. In contrast, polyaryletherketones are generally crystalline and hence are chemically more resistant but their glass transition temperature is generally lower and hence they tend to lose a substantial fraction of their mechanical strength at lower temperatures than do polyarylethersulphones. For use under demanding conditions of high temperature with exposure to various chemical environments neither the simple polyarylethersulphones nor the simple polyaryletherketones are entirely satisfactory.

As coatings on electrical conductors polyaryletherketones have good electrical insulating and other properties, but wires coated with them are not very pliable, and such coatings are somewhat vulnerable to surface crazing if a coated wire is bent in an arc of small radius, for example by winding coated wire around itself.

The invention provides a polymer composition containing a polyaryletherketone component and a polysulphone component characterised in that at least 5% by weight of each component is present, calculated on the total of these two components, and in that the polysulphone component is at least one polysulphone containing the repeating units $$-Ph-SO_2-Ph-Ph-SO_2-Ph- \quad \text{I}$$

and $$-Ar- \quad \text{II}$$

(where Ph is phenylene; and
Ar is a divalent aromatic radical) linked together through ether linkages and in a relative molar proportion of units I:units II in the range 25:75 to 50:50.

For convenience hereinafter, the polysulphone component containing the repeating units I and II will be referred to as "polysulphone" and the polyaryletherketone component will be referred to as "polyketone".

In the polysulphone, Ph is preferably para-phenylene, and Ar, which may be a mono- or poly-radical such as phenylene or biphenylene is preferably one in which aromatic groups are linked together through non-aromatic groups. More specifically Ar is of general formula $$-Ar^1-Z-Ar^1-$$

where
each $Ar^1$, which may be the same or different, is an optionally substituted divalent aromatic hydrocarbon radical; and Z is selected from —SO—, —SO$_2$—, —CO— and divalent aliphatic hydrocarbon radicals.

$Ar^1$ may be a mono- or poly-radical, preferably phenylene especially para-phenylene.

We particularly prefer that units I and II be respectively $$-Ph^1-SO_2-Ph^1-Ph^1-SO_2-Ph^1- \quad \text{IA}$$

and $$-Ph^1-SO_2-Ph^1- \quad \text{IIA}$$

where $Ph^1$ is para-phenylene. The ether linkage may link together two units I, or two units II or a unit I to a unit II.

In any particular polysulphone, there may be a plurality of different units satisfying the definition of units II but preferably units II are the same; a mixture of polysulphones each having different units II may be used.

If the polysulphone component contains a mixture of polysulphones, it preferably consists of two of them, one containing only units II, the other containing also units I, and the mixture contains nonetheless the units I and II in the said relative molar proportions in the range 25:75 to 50:50. Thus the mixture may for example contain 50% molar each of a polymer containing only units II and of a polymer containing units I and II in the relative molar proportions 50:50. If a mixture of polysulphones is used, it is preferably either of a polymer containing only units II with one containing units I and II in the relative molar proportions I:II in the range 25:75 to 50:50, or else is a mixture of polymers each of which contains units I and II in the relative molar proportions I:II in that range.

We have obtained useful results when the polysulphone component contains units IA and IIA in equimolar proportions.

The polyketone may be represented as a polymer having repeating units of general formula $$-Ar-CO-$$

where Ar is as defined. Ar may represent units of the same formula or various different formulae in particular polymer chain. Preferably Ar is of general formula $-Ar^1-Y-Ar^1-$ where
$Ar^1$ is as hereinbefore defined;
Y is —O— or a group $(Y^1-Ar^1)_mY^1-$;
$Y^1$ is —O— and/or —CO— and at least one $Y^1$ is —O—; and
m is 1 or 2.

The polyketone may itself contain sulphone groups but preferably not more than 25% of the total of the groups —SO$_2$— and —CO— in the polyketone.

The polyketone preferably contains units of formula $$-Ph-O-Ph-CO-; \text{ and/or} \quad \text{III}$$

$$-Ph-O-Ph-O-Ph-CO-; \text{ and/or} \quad \text{IV}$$

$$-Ph-O-Ph-Ph-O-Ph-CO-. \quad \text{V}$$

More particularly it consists essentially of units III or units IV or is a copolymer containing unit III or IV or both and also possibly units V, or other units, especially containing units IV with units III or V.

We have obtained a composition having a useful combination of properties when the polyketone consists essentially of units IV especially when the polysulphone consists essentially of units IA and IIA in substantially equimolar proportions.

The polymers of the composition are of high molecular weight. Melt viscosity, reduced viscosity or inherent viscosity may be used as an indication of the molecular weight. The polymers generally have a melt viscosity of at least 0.01, preferably at least 0.1 kNsm$^{-2}$ and up to 4 but especially not more than 2.0, kNsm$^{-2}$. Melt viscosity is measured using a ram extruder fitted with a 3.175 mm×0.5 mm die operating at a shear rate of 1000 s$^{-1}$, at a temperature dependent on the glass transition temperature or melting temperature of the polymer, typically 400° C. for polymers having a melting temperature up to about 370° C. Alternatively an indication of molecular weight can be obtained from the viscosity of a solution of polymer. Reduced viscosity is determined using one gram and inherent viscosity using 0.1 gram of polymer per 100 cm$^3$ of solution. The solvent used can be for example dimethylformamide and/or chlorinated solvents for several polyarylsulphones and concentrated sulphuric acid for several polyketones. Preferred polymers have a reduced viscosity or inherent viscosity in the range 0.2 to 3.0, especially 0.4 to 1.5, measured at 25° C. It is preferred that the polyketone has an inherent viscosity of at least 0.7, or even at least 1.0.

The proportions of the various polymer components will be dependent on the characteristics of each and the properties desired.

We generally prefer that each component be at least 10% by weight of the total polymer of the composition.

A composition containing 10 to 30% by weight of polyketone consisting essentially of units IV, the remainder being polysulphone consisting essentially of units IA and IIA in substantially equimolar proportions, has improved solvent resistance compared with the polysulphone alone but retains a substantial proportion of its mechanical properties to a temperature over of 200° C. It is suitable for use in the production of printed circuit boards, especially since it shows good resistance to distortion by solder.

Hence as a second aspect the invention provides a circuit board of which the substrate is formed from a composition containing 10 to 30% by weight of a polyketone, the remainder being a polysulphone, as hereinbefore defined. The polyketone preferably consists essentially of units IV and the polysulphone consists essentially of units IA and IIA in substantially equimolar proportions.

A composition containing 10 to 30% by weight of polysulphone consisting essentially of units IA and IIA in substantially equimolar proportions, the remainder being polyketone consisting essentially of units IV, has a combination of properties which make it suitable for wire coating or for the production of fibre or film. Specifically such a composition has improved environmental crack resistance compared to the polyketone alone and wires coated there with may require less force to bend the coated wire and show a greater degree of recoil on removal of the bending force. Furthermore, the compositions shrink less compared with the polyketone alone, on cooling from an elevated temperature, which is advantageous when preparing a shaped article.

Thus as a third aspect the invention provides an electrical conductor or bundle thereof having a coating formed from a composition according to the invention, preferably containing 10 to 30% by weight of a polysulphone as hereinbefore defined, the remainder being a polyketone. In particular each individual electrical conductor is insulated with, and the bundle of insulated conductors is coated with, such a composition.

In a fourth aspect the invention provides a film or fibre formed from a composition containing 10 to 30% by weight of a polysulphone as hereinbefore defined, the remainder being a polyketone.

The polysulphone in the third and fourth aspects is preferably one consisting essentially of units IA and IIA in substantially equal proportions and the polyketone is one consisting essentially of units IV.

Polysulphones and the preparation thereof are extensively described in the prior art such as, inter alia, in GB-A-1016245, 1060546, 1078234, 1109842, 1122192, 1133561, 1153035, 1153528, 1163332, 1177183, 1234301, 1264900, 1265144, 1286673, 1296383, 1298821 and 1303252, in Canadian 847963 and in DE-A-1938806 and 2433400. Polysulphones containing units I and the preparation thereof are described in GB-A-1397260 and in Polymer 18, (1977) pages 359 to 364 and 369 to 374.

Polyketones can be prepared by techniques similar to those used for polysulphones and, in particular, a polyketone containing repeating units IV, which is crystalline and tough and has an inherent viscosity of at least 0.7, is described in more detail in EP-A-001879. Other polyketones, and the preparation thereof, are described in U.S.-A-3,441,538, 3,442,857, 3,953,400, 3,956,240 and 4,247,682.

For many applications the compositions may be used with few if any additives other than stabilisers. However, other additives may be incorporated and, for convenience the term "filled composition" will be used to mean the composition which also contains at least one additive. The filled composition can include, for example, inorganic and organic fibrous fillers such as glass fibre, carbon fibre and poly-paraphenyleneterephthalamide fibre; organic and inorganic non-fibrous fillers such as polytetrafluoroethylene, graphite, boron nitride, mica, talc and vermiculite; nucleating agents; and stabilisers.

Preferably the total proportion of additives, when present, is at least 0.1% and up to 80, especially up to 70% by weight of the filled composition. The filled composition can contain for example 5 to 30% by weight of boron nitride; or at least 20% by weight of short glass or carbon fibre; or 50 to 70, especially about 60, % by volume of continuous glass or carbon fibre; or a mixture of a fluorine-containing polymer, graphite and an organic or inorganic fibrous filler wherein the total proportion of these additives is preferably 20 to 50% by weight.

The composition may be made by mixing its components for example by particle or melt blending. More specifically, the polyketone and polysulphone components in the form of dry powders or granules can be mixed together by a technique such as tumble blending or a high speed mixer. The blend thus obtained may be extruded into a lace which is chopped to give granules. The granules can be used for example in injection moulding or extrusion, to give a shaped article such as a film, fibre or coated wire.

Filled compositions may be obtained in a similar manner by mixing the additive or additives with the components of the composition or with granules of the mixed components.

Films, foils, powder or granules of the composition can be laminated with a fibrous filler material in the form of mats or cloths.

Compositions containing fibrous filler materials may be obtained by passing essentially continuous fibre, for example of glass or carbon, through a melt of the composition or containing it. The product, a fibre coated with the composition, may be used alone or together with other materials, for example a further quantity of the composition, to form a shaped article. The production of filled compositions by this technique is described in more detail in EP-A 56703, 102158 and 102159.

In the production of shaped articles from the compositions or filled compositions, the crystallinity of the polymers developed as far as possible during fabrication including any annealing stage, because otherwise crystallisation could continue during subsequent use and result in dimensional changes, warping or cracking and general change in physical properties. Furthermore, increased crystallinity results in improved environmental resistance.

Crystallinity in the compositions is due mainly, and in most of them solely, to the polyketone. To achieve improved crystallisation behaviour, the compositions may be modified by having, particularly on the chains of the polyketone, terminal ionic groups —A—X, where A is an anion and X is a metal cation.

The anion is preferably selected from sulphonate carboxylate, sulphinate, phosphonate, phosphate, phenate and thiophenate and the metal cation is an alkali metal or alkaline earth metal.

In such modified compositions the crystallisation temperature Tc may be raised by at least 2° C. in comparison with a similar composition not containing the ionic end-groups. However, useful compositions are obtained even when there is little or no change in Tc if sufficient nucleation results from the presence of end groups to increase the number of spherulites in comparison with a similar polymer composition without the ionic end groups.

Modified polymers which may be included in the composition are most suitably produced by reaction of a preformed polymer with reactive species containing the ionic group. Procedures for the production of modified polymers are described in more detail in our EP-A-152161.

Further aspects of the invention are set out in the following illustrative examples.

EXAMPLES 1 TO 9

A polyketone and a polysulphone were dry mixed by tumble blending polymer powder for 5 to 10 minutes in the proportions by weight indicated in Table One. The polyketone consisted essentially of units IV and had a melt viscosity of about 0.1 kNsm$^{-2}$ measured at 400° C. and the polysulphone consisted essentially of units IA and IIA in essentially equimolecular proportions, the units in each polymer being linked together through ether linkages. The polysulphone had a reduced viscosity of 0.37 measured in N,N-dimethylformamide.

The polymer blend was melt homogenised in a Brabender rheometer operating at 400° C. for 5 to 10 minutes, and the molten blend was formed into a film of thickness 250–300 microns by compression moulding at 360° C. at an applied pressure of 0.14 MNm$^{-2}$ then cooling the film obtained in air. A film was formed in a similar manner from the sulphone polymer alone.

Solvent resistance test

Each film was immersed in about 50 cm$^3$ of dichloromethane without agitation at ambient temperature for a week. The gain in weight is reported in Table One.

TABLE One

| Example | Composition % w/w | | Wt again % (b) |
|---|---|---|---|
| | PK | PS | |
| 1 | 90 | 10 | 24 |
| 2 | 80 | 20 | 26 |
| 3 | 70 | 30 | 30 |
| 4 | 60 | 40 | 30 |
| 5 | 50 | 50 | 30 |
| 6 | 40 | 60 | 70 |
| 7 | 30 | 70 | B |
| 8 | 20 | 80 | B |
| 9 | 10 | 90 | B |
| A | 0 | 100 | D |

Notes to Table One
(a) PK is the polyketone above mentioned. PS is the polysulphone above mentioned.
(b) B indicates the film was swollen and weakened and broke on attempting to remove it from the dichloromethane.
D indicates that the polymer dissolved.

Short-period solvent resistance test

The effects of immersing film samples in dichloromethane for shorter periods of time are reported in Table Two.

TABLE Two

| Time min | Wt gain % | | |
|---|---|---|---|
| | A (d) | 8 (d) | 9 (d) |
| 20 | D | 26 | 38 |
| 50 | — | 40 | 40 |
| 180 | — | 48 | 66 |
| 1200 | — | 48 | 66 |

Notes to Table Two
(d) A is film formed from the sulphone polymer only and 8 and 9 are films formed from samples of the compositions of Examples 8 and 9.

EXAMPLE 10

A composition was prepared from 80% weight of a different grade of polyketone ('Victrex' (Registered Trade Mark) PEEK aromatic polymer 380 grade, obtainable from Imperial Chemical Industries PLC) and 20% weight of polysulphone as used in Examples 1 to 9.

EXAMPLE 11

A sample of the composition of Example 10 was coated onto a 0.3 mm diameter copper wire using an 18 mm Bone extruder fitted with a Betol designed tubing wire coating die. The wire was passed through the die at a rate of about 15 m/minute and the extruder was operated at a rate to give a coating of average thickness 0.3 mm. The die temperature for wire coating was about 380° C.

For the purposes of comparison, samples of the copper wire were also coated with the polyketone alone.

The results of tests of solvent resistance and pliability are set out in Tables Three and Four respectively

TABLE THREE

| Test (e) | Solvent resistance | |
|---|---|---|
| | Coating (f) | |
| | B | 11 |
| 1D wrap | some small cracks | some small cracks |
| 5D wrap | some large cracks | some small cracks |
| 8D wrap | many large cracks | some large cracks |

TABLE THREE-continued

| | Solvent resistance | |
|---|---|---|
| Test | Coating (f) | |
| (e) | B | 11 |
| 20D wrap | many large cracks | some large cracks |

Notes to Table Three
(e) The coated wires were wrapped round mandrels (glass tubes) of diameter 1, 5, 8 and 20 times that of the coated wire to give 1D, 5D, 8D and 20D wrap respectively. The wires wrapped round the mandrels were immersed in isopropanol containing a red dye for 24 hours at 60° C.. The coatings were examined under a microscope for cracking (shown by the dye).
(f) B indicates wire coated with the polyketone (as used in Example 10) only. 11 indicates wire coated with the composition of Example 10.

11 indicates wire coated with the composition of Example 10.

TABLE FOUR

| | | Pliability | |
|---|---|---|---|
| Coating | Load applied | Recoil | |
| (f) | (g) (h) | Degrees (i) | %(i) |
| B | 250 | 45–50 | 50–56 |
| 11 | 90–100 | 70 | 78 |

Notes to Table Four
(f) is as defined in Notes to Table Three.
(h) The coated wires were bent through 90° over a 6 mm diameter mandrel using the specified load applied. The load was then removed and the amount of recoil measured.
(i) Recoil is measured from the 90° of arc and is expressed both in degrees of arc and as a percentage of 90°. (90° of recoil = 100% recoil, that is the wire straightens on releasing the load).

EXAMPLE 12

A sample of the composition of Example 10 was melt homogenised in a single screw extruder and extruded to form a tape of one inch (25.4 mm) width. Similar tapes were formed using the polyketone (as used in Example 10) only. The tape formed from the composition of Example 10 had a tensile modulus at least as high as that formed from the polyketone only. The tapes from both materials had a similar yield strength.

The shrinkage of the tapes was determined at 150° C. and 200° C. At 150° C. the shrinkage of the tape formed from the composition of Example 10 was about one fifth of a tape formed from the polyketone only. At 200° C. the shrinkage of the tape formed from the composition of Example 10 was about one twentieth that of tape formed from the polyketone only.

EXAMPLE 13

A sample of the composition of Example 10 was subjected to a flammability test as set out in BS 4066, part 1, 1980, and was found to meet the requirement for coated cable.

EXAMPLE 14

A sample of the composition of Example 10 was subjected to thermo-gravimetric analysis. There was no sign of degradation at 400° C. for one hour in air, and no changes were observed when the temperature was raised at a rate of 10° C./minute to 500° C.

EXAMPLES 15 AND 16

Polyketone ('Victrex' (Registered Trade Mark) PEEK aromatic polymer, 450 P grade, obtainable from Imperial Chemical Industries PLC) and a polysulphone as used in Examples 1 to 9 were dry mixed by tumble blending powders for 5 to 10 minutes in the proportions by weight 90:10 (Example 15) and 80:20 (Example 16) respectively. The particulate blend was then subjected to melt blending at 380° C. using a single screw Plaston extruder having a one inch (25.4 mm) diameter screw. The extruded lace was granulated. The granules obtained were injection moulded into test pieces using an Arburg injection moulding machine operating at 380° C. with a mould temperature of about 160° C. The mechanical properties of the moulded samples are reported in Table Five.

TABLE Five

| Sample (j) | Flex Mod (GN/m$^2$) (k) | Tensile Strength (MN/m$^2$) (l) | Impact Fracture Toughness (MN/m$^{3/2}$) (m) |
|---|---|---|---|
| 15 | 3.28 | 88 | 2.4 |
| 16 | 3.08 | 94 | 1.6 |

Notes to Table Five
(j) Samples 15 and 16 are, respectively, test pieces formed from compositions of Examples 15 and 16.
(k) Flexural modulus is determined at 23° C. using a central deflection rate of 5 mm/minute and a three point bending method.
(l) Tensile strength is measured using a tensile loading to give an elongation rate of 5 mm/minute.
(m) Impact fracture toughness is measured using a three point bending technique at a temperature of −65° C.

I claim:

1. In an electrical conductor carrying a polyetherketone insulating layer, the improvement resulting in increased pliability and resistance to surface crazing of the layer, which comprises blending with the polyetherketone a polysulphone containing the repeating units $$—Ph—SO_2—Ph—Ph—SO_2—Ph— \qquad I$$

and $$—Ar— \qquad II$$

(where
Ph is phenylene and
Ar is a divalent aromatic radical)
linked together through ether linkages and in a relative molar proportion of units I:units II in the range 25:75 to 50:50, wherein said composition contains 10 to 30% by weight of a polysulphone, the remainder being a polyketone of formula $$—Ph—O—Ph—O—Ph—CO— \qquad IV.$$

2. A film or fibre formed from a composition containing 10 to 30% by weight of a polysulphone containing the repeating units $$—Ph^1—SO_2—Ph^1—Ph^1—SO_2—Ph^1— \qquad IA$$

and $$—Ph^1—SO_2—Ph^1— \qquad IIA$$

where
Ph$^1$ is para-phenylene,
linked together through ether linkages and in a relative molar proportion of units I:units II in the range 25:75 to 50:50, the remainder being a polyketone of the formula $$—Ph—O—Ph—O—Ph—CO— \qquad IV.$$

3. A circuit board of which the substrate is formed from a composition containing 10 to 30% of a polyketone of the formula —Ph—O—Ph—O—Ph—CO— IV, the remainder being a polysulphone containing the repeating units —Ph$^1$—SO$_2$—Ph$^1$—Ph$^1$—SO$_2$—Ph$^1$— IA and —Ph$^1$—SO$_2$—Ph$^1$— IIA where
  Ph$^1$ is para-phenylene,
linked together through ether linkages and in a relative molar proportion of units I:units II in the range 25:75 to 50:50.

* * * * *